United States Patent
Frangen

(10) Patent No.: US 9,513,321 B2
(45) Date of Patent: Dec. 6, 2016

(54) SENSOR SYSTEM FOR MONITORING SURROUNDINGS ON A MECHANICAL COMPONENT, AND METHOD FOR ACTUATING AND EVALUATING THE SENSOR SYSTEM

(75) Inventor: Joachim Frangen, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 610 days.

(21) Appl. No.: 13/997,375

(22) PCT Filed: Dec. 9, 2011

(86) PCT No.: PCT/EP2011/072343
§ 371 (c)(1),
(2), (4) Date: Sep. 13, 2013

(87) PCT Pub. No.: WO2012/089486
PCT Pub. Date: Jul. 5, 2012

(65) Prior Publication Data
US 2013/0342224 A1   Dec. 26, 2013

(30) Foreign Application Priority Data
Dec. 29, 2010 (DE) .......................... 10 2010 064 328

(51) Int. Cl.
*G01R 27/26* (2006.01)
*G06F 3/044* (2006.01)
(Continued)

(52) U.S. Cl.
CPC .......... *G01R 27/2605* (2013.01); *B25J 13/086* (2013.01); *B25J 19/06* (2013.01);
(Continued)

(58) Field of Classification Search
CPC ........ G01R 27/2605; G01D 5/24; G06F 3/044
(Continued)

(56) References Cited

U.S. PATENT DOCUMENTS

| 4,584,625 A | 4/1986 | Kellogg |
| 4,908,574 A | 3/1990 | Rhoades et al. |

(Continued)

FOREIGN PATENT DOCUMENTS

| CN | 1695038 | 11/2005 |
| CN | 1864124 | 11/2006 |

(Continued)

OTHER PUBLICATIONS

International Search Report for PCT/EP2011/072343, dated Mar. 5, 2012.
(Continued)

*Primary Examiner* — Amy He
(74) *Attorney, Agent, or Firm* — Norton Rose Fulbright US LLP; Gerard Messina

(57) ABSTRACT

A sensor system for monitoring surroundings on a mechanical component, includes at least one capacitive sensor element that is attachable to the surface of machines or machine parts, the at least one sensor element being constructed from a layered structure of flexible electrically conductive and electrically insulating plies, electrically conductive potential surfaces of one ply being disposed, laterally spaced apart via insulating plies located therebetween, in such a way that electric field lines form between the conductive potential surfaces and change measurably upon proximity and/or contact of a body or an object. The layered structure of a sensor element has at least two measuring elements operating separately from one another.

13 Claims, 2 Drawing Sheets

(51) Int. Cl.
*B25J 13/08* (2006.01)
*B25J 19/06* (2006.01)
*G01D 5/24* (2006.01)
*G01L 1/14* (2006.01)
*F16P 3/14* (2006.01)

(52) U.S. Cl.
CPC .............. *F16P 3/148* (2013.01); *G01D 5/24* (2013.01); *G01L 1/146* (2013.01); *G06F 3/044* (2013.01)

(58) Field of Classification Search
USPC ................................................ 324/686, 658
See application file for complete search history.

(56) References Cited

U.S. PATENT DOCUMENTS

| | | | |
|---|---|---|---|
| 5,656,785 A | | 8/1997 | Trainor et al. |
| 5,802,479 A | * | 9/1998 | Kithil et al. ................. 701/45 |
| 7,119,554 B2 | * | 10/2006 | Nakamura et al. .......... 324/681 |
| 7,138,809 B2 | * | 11/2006 | Nakamura et al. .......... 324/681 |
| 2008/0122458 A1 | * | 5/2008 | Lenz ............................ 324/687 |

FOREIGN PATENT DOCUMENTS

| | | |
|---|---|---|
| DE | 20 2005 002 475 | 6/2006 |
| DE | 10 2009 029 021 | 3/2011 |
| GB | 2 072 389 | 9/1981 |
| GB | 2 141 873 | 1/1985 |
| JP | 56-114028 | 9/1981 |
| JP | 2000-48694 | 2/2000 |
| JP | 2003-28741 | 1/2003 |
| JP | 2008-4465 | 1/2008 |
| JP | 2008-292168 | 12/2008 |
| WO | WO 2007/098171 | 8/2007 |

OTHER PUBLICATIONS

Akasofu, et al., "A Thin-filmed Variable Capacitance Shear Force Sensor for Medical and Robotics Applications", New Frontiers of Biomedical Engineering—Innovations form Nuclear to Space Technology, 13th Annual International Conference of the IEEE Engineering in Medicine and Biology Society: Oct. 31-Nov. 3, 1991, pp. 1601-1602.

* cited by examiner

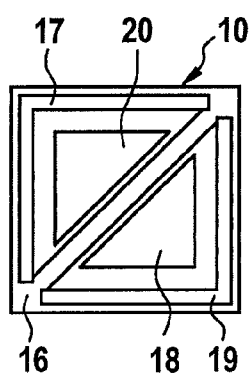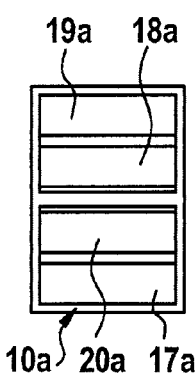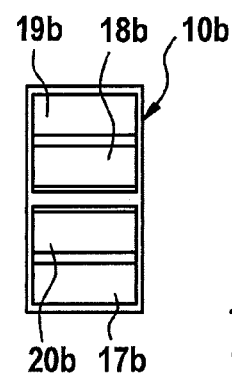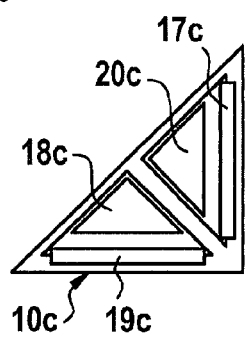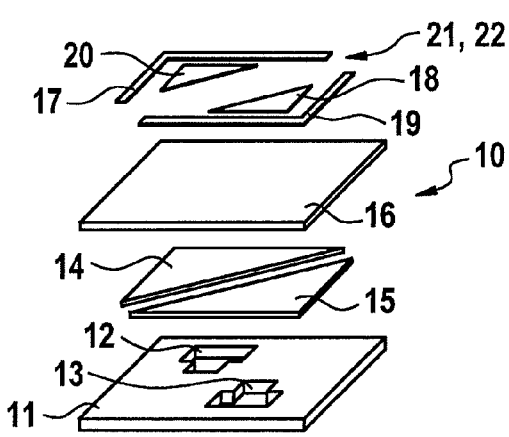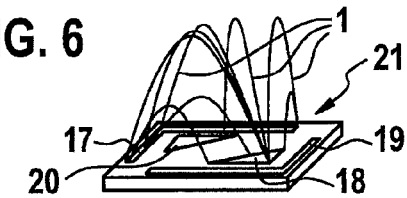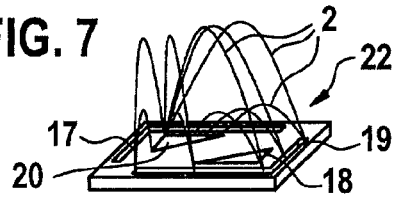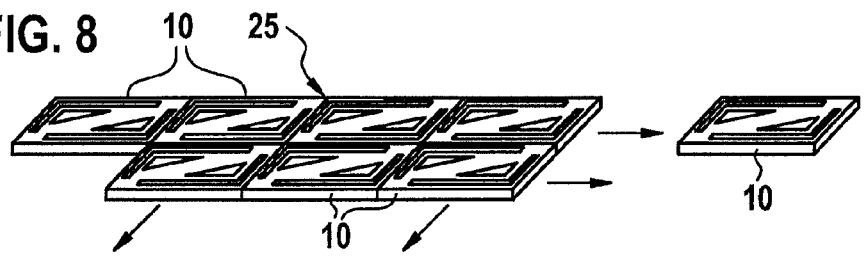

SENSOR SYSTEM FOR MONITORING SURROUNDINGS ON A MECHANICAL COMPONENT, AND METHOD FOR ACTUATING AND EVALUATING THE SENSOR SYSTEM

BACKGROUND OF THE INVENTION

1. Field of the Invention

The present invention relates to a sensor system for monitoring surroundings on a mechanical component, and further relates to a method for applying control to, and for evaluating, a sensor system according to the present invention.

2. Description of the Related Art

Published German patent application document DE 10 2009 029 021 A1 (which is not considered a prior art) discloses a sensor system, which is attachable to surfaces of machines or machine parts, and which has at least one sensor element made up of a layered structure of flexible electrically conductive and electrically insulating plies. The proximity and/or contact of a body or an object can be measured using such a sensor system, for example in order to stop the operation of an assembly robot having a sensor system.

It is furthermore known per se that for automatic proximity detection and/or collision detection, monitoring of the surroundings of the machine is performed using different sensor principles and sensors, for example optical sensors, ultrasonic sensors, or capacitive sensors, for example including contact-force sensing via the piezoelectric effect. Such sensors can as a rule be used in special cases, for example, in order to monitor machine parts having simple shapes and defined movement paths, so that upon detection of the proximity of a person, for example, reliable deceleration of the drive systems or processing equipment of the machine can be initiated.

If the hazardous machine part has a surface of relatively complex shape or a complex trajectory, on the one hand uninterrupted sensor-based surroundings monitoring is often possible only with a great deal of outlay or in some cases not at all. For example, optical sensing can be impeded by shadowing at edges and undercuts of the machine surface, or integration of sensors can also be impossible for lack of installation space.

For safe operation of machines it is usual, in order to meet safety standards, to utilize safety devices having two mutually independent safety channels with a diagnostic function, so that a single error in the system does not result in loss of safety. Failure of a safety channel is reliably detected and reported, while the second safety channel maintains the safety function. Dual sensor-based monitoring, embodied independently, is necessary for such applications. Sensors for safe configuration of machines having two safety channels that are flexibly adaptable to complexly shaped surfaces are not known.

Also known, from published utility model document DE 20 2005 002 475 U1, is a foamed-material cover, embodied especially to be used for collision detection with industrial robots, that is equipped with proximity-detecting, tactile, and capacitive sensors. Attachment of such an assemblage to different industrial robots is, however, often laborious.

BRIEF SUMMARY OF THE INVENTION

The present invention is based on the object of embodying a sensor system, attachable in simple fashion to a wide variety of components or surfaces of machines or machine parts, that at the same time enables compliance with safety standards that require mutually independent safety channels with a diagnostic function. The underlying idea of the invention is to embody sensor elements with a layered structure of flexible electrically conductive and electrically insulating plies, electrically conductive potential surfaces of one ply being disposed, laterally spaced apart via insulating plies located therebetween, in such a way that electric field lines form between the conductive potential surfaces and change measurably upon proximity and/or contact of a body or an object, the layered structure of a sensor element having at least two measuring elements operating separately from one another. The flexible layered structure makes possible simple adaptation and attachment of the sensor element and sensor system onto moving components of machines or complexly shaped surfaces of the machines, and the provision of at least two measuring elements for each sensor element, operating separately from one another, simultaneously allows safety standards to be met.

An embodiment of the invention in which the sensor element encompasses means for separate application of control to and evaluation of the at least two measuring elements is particularly preferred. This ensures that even in the event of impairment of or damage to a measuring element, the respectively other measuring element can continue to operate.

In order to preclude mutual impairment of the measured values of the at least two measuring elements, provision is furthermore made that the means for separate application of control and evaluation apply control to the at least two measuring elements in chronologically consecutive fashion.

In order to enable particularly safe operation of machines in a manner corresponding to compliance with safety standards, thus precluding endangerment in particular of persons, provision is moreover made that evaluation means for evaluating the measured signals of the at least two measuring elements are provided; and that the evaluation means are at least indirectly operatively connected to the machines or machine parts and apply control thereto in such a way that operation of the machines or machine parts occurs only if the signals of the at least two measuring elements are within predetermined limit values.

In a design-related configuration of the sensor elements that enables adaptation of a sensor system, made up of multiple sensor elements, to a wide variety of surfaces of machines or machine components, it is proposed that the at least one sensor element have a base outline in the shape of a triangle or quadrangle; and that when multiple sensor elements are present, they be electrically and mechanically contactable to one another and preferably form a sensor skin.

A particularly compact and simple configuration of the sensor elements is moreover made possible when the measuring elements are disposed together on at least one layer, and are physically separated from one another.

The invention also encompasses a method for applying control to and evaluating a sensor system according to the present invention. Provision is made in this context that when multiple sensor elements are present, at least one electronic evaluation device having means be provided, which device cyclically addresses the sensor elements and checks whether a significant change in capacitance with respect to a reference value has taken place in the context of at least one sensor element; and that the means address the at least two measuring elements of a sensor element in chronologically successive fashion. Such a method operates particularly reliably and dependably, since mutual influencing of the measured values of the two measuring elements of a sensor element is avoided.

Particularly fast and thus reliable sensing of impending collisions is enabled if a measuring element of a first sensor element and another measuring element of another sensor element are addressed at the same point in time by the means.

The design outlay and the outlay necessary for wiring the measuring elements can be reduced if the sequence of the sensor elements is used to address linearly concatenated sensor elements, by the fact that the data are forwarded along the chain to the means via multiple sensor elements.

Also particularly preferred is a method in which, in a further cycle, each sensor element is subjected to a self-diagnosis, the sensor elements being acted upon by test voltages or by a characteristic signal pattern. Such a method makes it possible in particular to reliably detect damage to the sensor elements, thus enabling particularly reliable operation of a sensor system.

DETAILED DESCRIPTION OF THE DRAWINGS

FIG. 1 is a simplified plan view of a single sensor element of a sensor system according to the present invention.

FIG. 2 is an exploded view of the structure of a sensor element according to FIG. 1.

FIG. 3 to FIG. 5 are plan views of sensor elements having different shapes and modified with respect to FIG. 1.

FIG. 6 and FIG. 7 are perspective views of a sensor element according to FIG. 1 during application of control to its two measuring elements at different points in time.

FIG. 8 is a perspective view of a portion of a sensor skin using sensor elements connected to one another.

DETAILED DESCRIPTION OF THE INVENTION

Figure 9:
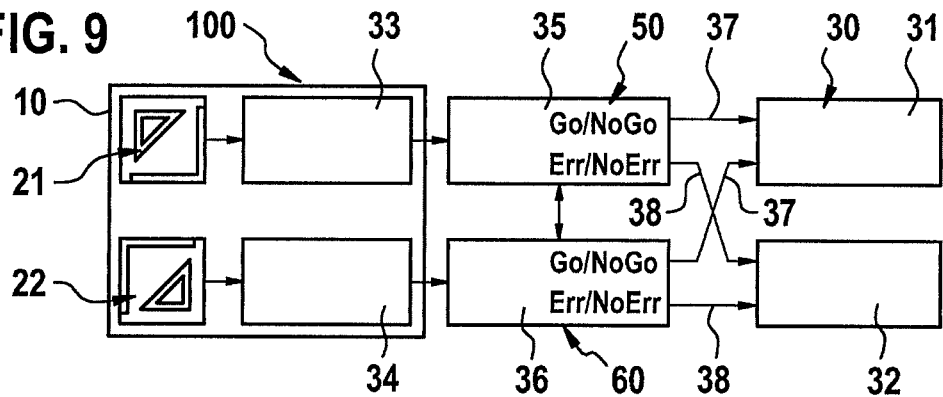
FIG. 9 is a block diagram to illustrate the application of control to the measuring elements of a sensor element.

Identical components and components having the same function are labeled in the Figures with the same reference numbers.

FIGS. 1 and 2 depict a sensor element 10 as a component of a sensor system 100 to be explained in further detail later. Sensor system 100 or sensor element 10 serves to monitor surroundings on a mechanical component, for example on a moving robot arm of an industrial robot or the like.

As is evident in particular from FIG. 2, sensor element 10 has a layered structure made up of multiple interconnected flexible layers. This layered structure contains, by way of example and therefore not in limiting fashion, a base layer 11, made for example of sponge rubber or rubber, having a thickness of, for example, 5 mm. Embodied within base layer 11 are two cutouts 12, 13 for the reception of an electronic system not depicted in FIGS. 1 and 2, or of electronic components. The underside of base layer 11 is disposed in abutment against, for example, the mechanical component. Disposed on the upper side of base layer 11 are two grounding surfaces 14, 15 that are separated from one another and are each triangular. The two grounding surfaces 14, 15 are each made, by way of example, of a nonwoven copper fabric having a thickness of 0.5 mm. The two grounding surfaces 14, 15 are covered, on the side located opposite base layer 11, by an insulating layer 16 that is made, by way of example, of sponge rubber having a thickness of 1.5 mm. On the upper side of insulating layer 16, the latter is connected to a total of four electrode surfaces 17 to 20, made in particular of copper and constituting electrically conductive potential surfaces. While on the one hand electrode surfaces 17 and 19 are each embodied in the form of an angle member having two limbs of identical length, the other two electrode surfaces 18 and 20 are each of triangular configuration. In addition the two electrode surfaces 17 and 19 act as transmitting electrodes, while the two electrode surfaces 18 and 20 act as receiving electrodes. The two grounding surfaces 14 and 15, on the other hand, act as shielding electrodes. It is also essential that electrode surfaces 17 to 20 are each disposed at a distance from one another. Electrode surfaces 17 and 18 form a first measuring element 21, while the other two electrode surfaces 19 and 20 form a second measuring element 22.

As is evident in particular from FIGS. 6 and 7, upon application of a voltage respectively to first measuring element 21 and to second measuring element 22, a respective electric field having respective field lines 1 and 2 forms between the respective electrode surfaces 17 and 18, and 19 and 20. In other words, this means that first measuring element 21 and second measuring element 22 each constitute a capacitive sensor whose respective field lines 1 and 2 change at the proximity of an object or a person, for example starting at a distance of less than 30 to 60 mm. This change in field lines 1, 2 results in a change in the capacitance of the two respective measuring elements 21 and 22, which is sensed by sensor element 10.

In order to prevent mutual influencing of the measurement results of the two measuring elements 21, 22 of sensor element 10 that would exist as a result of field lines 1, 2 that are present simultaneously, provision is made according to the present invention that the two measuring elements 21, 22 have control applied to them in chronologically successive fashion. This situation is depicted in FIGS. 6 and 7: in FIG. 6, by way of example, first measuring element 21 having field lines 1 is activated, while the other measuring element 22 is deactivated. In FIG. 7, conversely, second measuring element 22 is activated so that field lines 2 are formed, while first measuring element 21 is deactivated.

Sensor element 10 depicted in FIG. 1 has in plan view a square base outline having, by way of example, an edge length of approximately 60 mm. FIGS. 3 and 4 depict modified sensor elements 10a and 10b that each have a rectangular base outline. Sensor element 10a has edge lengths of, by way of example, 40 mm and 60 mm, while sensor element 10b has edge lengths of 30 mm and 60 mmm. In sensor elements 10a and 10b, electrode surfaces 17a, 17b, 18a, 18b, 19a, 19b, and 20a, 20b are each of rectangular or ribbon-shaped configuration, and are disposed in alternately spaced-apart fashion on the upper side of the respective sensor element 10a, 10b. Sensor element 10c depicted in FIG. 5, on the other hand, has a triangular shape in plan view, the edge length of the two short limbs being, by way of example, 60 mm in each case. While one the one hand electrode surfaces 17c and 19 are each of ribbon-shaped configuration, the two other electrode surfaces 18c and 20c each have a triangular shape.

FIG. 8 depicts a portion of a sensor skin 25 that is made up of a plurality of sensor elements each configured, in the exemplifying embodiment, in square fashion. Sensor elements 10 are connected to one another at their lateral surfaces both mechanically, e.g. in the form of gripping strips, and electrically, for example in the form of plug connections (not depicted). What is essential here is that in the context of the electrical connection of sensor elements 10, the respective first measuring elements 21 and the respective second measuring elements 22 are electrically connected to one another. A connection in the form of a linear concatenation of sensor elements 10 thus takes place.

It is of course conceivable and usual in practice, as a modification of the exemplifying embodiment depicted in FIG. 8, to mechanically and electrically interconnect differently shaped sensor elements 10, 10a, 10b, 10c so as thereby to constitute a sensor skin 25 that is adapted to the shape of the machine part to be monitored, for example an arm of an industrial robot, in such a way that sensor skin 25 can, for example, be placed around the robot arm. Provision is likewise made for this purpose that the machine part to be monitored by sensor skin 25, and sensor skin 25, are connected to one another, for example, once again using gripping elements. Gripping elements of this kind allow sensor skin 25 to be rapidly placed onto and removed from the machine component. In addition, sensor skin 25 can be covered with a nonconductive, for example textile, protective layer that keeps moisture, dirt, and other physical or chemical disrupting influences away from sensor skin 25. Field lines 1, 2 penetrate through this protective layer, so that the sensor function is not impaired.

Sensor system 100 has, besides the previously described sensor elements 10, 10a, 10b, and 10c, two central units 50, 60 for monitoring the two measuring elements 21, 22 of sensor elements 10, 10a, 10b, 10c, which units will be described in further detail below. Sensor system 100 furthermore encompasses a computer software program for application and maintenance of sensor system 100, and accessory material, for example cables, gripping tape, and installation material, in order to fasten sensor system 100 on the component to be monitored. The component to be monitored, for example a part of an industrial robot, has a controller 30 depicted in FIG. 9 that, in the case of an industrial robot, encompasses at least a robot controller 31 and a safety controller 32. It is also evident from FIG. 9 that sensor system 100 is operatively connected both to robot controller 31 and to safety controller 32. FIG. 9 depicts sensor system 100 using the example of a single sensor element 10 with its two measuring elements 21 and 22. It is evident that each of the two measuring elements 21, 22 has a respective input stage 33, 34 associated with it. Input stages 33, 34 are, in particular, a component of the electronic system of sensor element 10 disposed in cutouts 12, 13. The two input stages 33, 34 are operatively connected to an evaluation stage 35, 36 that is a component of central units 50, 60. The two output stages 35, 36 each have a Go/No Go output 37 that is connected to robot controller 31, while an Err/No Err output 38 is operatively connected to safety controller 32.

As already explained, the two measuring elements 21 and 22 of each sensor element 10 have control applied to them in chronologically successive fashion. In this context, the capacitance of electrode surfaces 17, 18 and 19, 20 is respectively sensed and is compared to a predetermined limit value or values. In the presence of a specific rate of change in the capacitance, or if the capacitance exceeds or falls below the previously discussed limit values, a collision-risking proximity between sensor element 10 and an object, for example a person, is inferred therefrom. In this case a No Go signal is generated at the respective Go/No Go output 37 of the respective measuring element 21, 22, and is delivered to robot controller 31 as an input value. Robot controller 31 thereupon reacts, for example, with a decrease in the motion speed, or a stoppage, of the handling robot. It is sufficient for this if a corresponding signal is generated at one of the two measuring elements 21, 22 of a sensor element 10. In addition, as will be explained in further detail below, the two measuring elements 21, 22 are subjected to a cyclically repeating self-diagnosis whose result is outputted at Err/No Err output 38 of the respective measuring element 21, 22. If an error of measuring element 21, 22 is inferred within the self-diagnosis at first measuring element 21 or at second measuring element 22, a corresponding signal is generated at Err/No Err output 38 and is delivered to safety circuit 32 as an input signal. Safety controller 32 thereupon reacts, for example, by once again stopping or restricting the operation of the industrial robot. What takes place is therefore a two-channel, mutually independent checking of the surroundings in terms of proximity events, as well as corresponding self-diagnosis.

Figure 10:
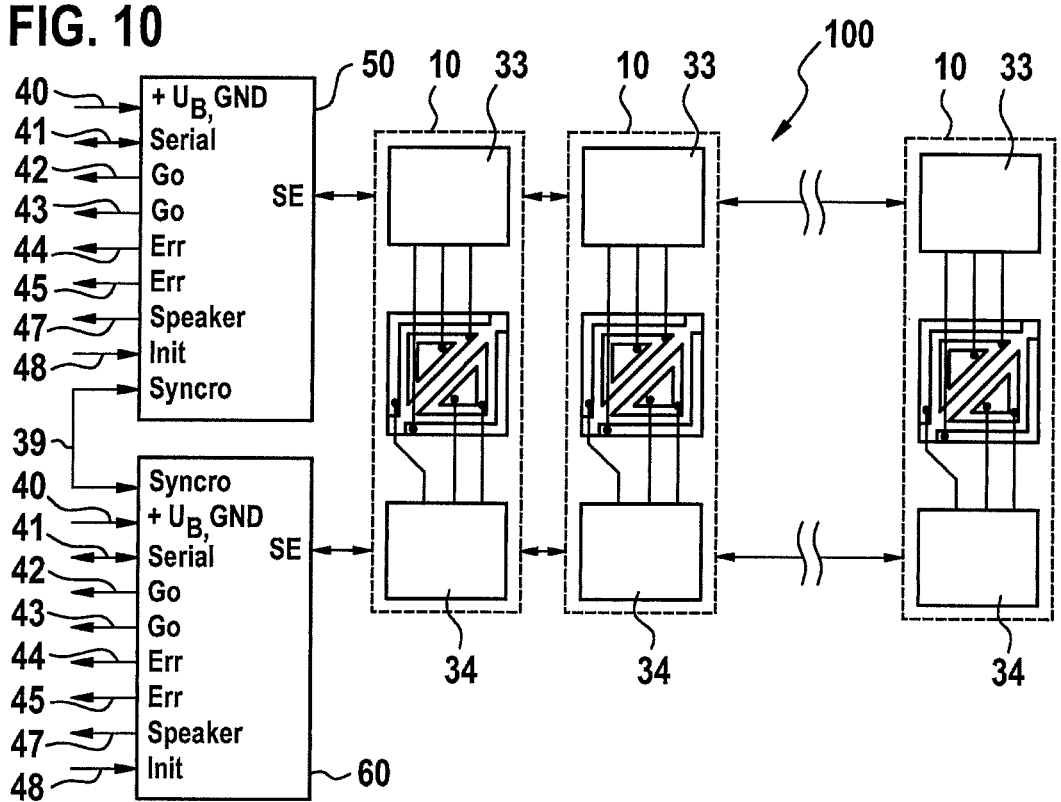
FIG. 10 is a block diagram to depict a sensor system made up of multiple sensor elements.

As already explained, evaluation stages 35, 36 are a component of the respective central unit 50, 60. FIG. 10 now depicts the situation in which an arbitrary number of sensor elements 10 are electrically (and mechanically) interconnected in the form of a chain. It is also evident in particular that the respective input stages 33, 34 of the respective measuring elements 21, 22 are connected to one another. The two central units 50, 60 successively cyclically query the respective measuring elements 21, 22 of sensor elements 10, provision preferably being made that each of sensor elements 10 has a specific address on the basis of which the respective sensor element 10 can be identified in terms of its position in sensor skin 25. The two central units 50, 60 are connected and synchronized with one another via a connection 39 in such a way that the querying or addressing of the individual sensor elements 10 by central units 50, 60 occurs successively. It is moreover evident that the two central units 50, 60 are each identically configured and have a voltage supply 40, a serial interface 41 for optional connection of a PC, outputs 42, 43 as respectively a Go and No Go signal for robot controller 31, outputs 44, 45 as respectively an Err and No Err signal for safety controller 32, a connector 47 for a loudspeaker, and an input 48 that is connected to robot controller 31.

Figure 11:
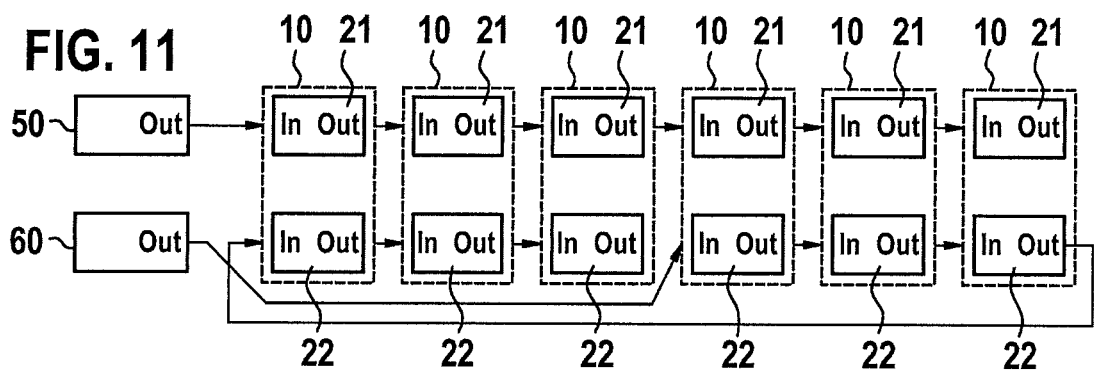
FIG. 11 depicts the application of control to the different measuring elements of the sensor elements by different central units.

FIG. 11 depicts the sequence over time of a possible application of control to sensor elements 10 by central units 50, 60. It is evident in particular that in a context of, for example, six sensor elements 10, the one central unit 50 applies control to the respective first measuring elements 21 successively, beginning with the first sensor element 10. Second central unit 60, on the other hand, applies control to fourth sensor element 10 at its second measuring element 22 at a point in time at which first central unit 50 is applying control to first measuring element 21 of first measuring element 10. Control is then applied to the fifth and sixth sensor element 10, and then to the first three sensor elements 10. In other words, this means that although both central units 50, 60 are each applying control at one and the same time to a sensor element 10 at its respective measuring element 21, 22, control is nevertheless never being applied simultaneously by the central units to both measuring elements 21, 22 at one and the same sensor element 10.

The respective sensor elements 10 are addressed by central units 50, 60 electronically, by way of a shift register. After each cycle of a main program loop, each sensor element 10 is read out once and stored in the RAM region of the microcontroller.

All sensor elements 10, connecting cables, and the microcontroller are subjected to a cyclic self-diagnosis so that, for example, the industrial robot can be reliably shut down in the event of malfunction. While central units 50, 60 and their connector cables are usually mounted immovably in an electrical cabinet, sensor elements 10 and their connecting cables are exposed to the movement of, for example, the robot arm and to possible collisions. Each sensor element 10 is completely checked by the self-diagnosis several times per second. Interruptions, shorts to ground, shorts to operating voltages, a failure of electronic components, and further errors are detected. The errors are diagnosed, for example, on the basis of six diagnostic criteria. These diagnostic criteria can be generated, for example, after applying test voltages or characteristic signal patterns to sensor elements 10; it is sufficient for one of the six diagnostic criteria to respond in order to generate a corresponding error signal in the context of self-diagnosis.

Sensor system 100 so far described, as well as sensor elements 10, 10a, 10b, 10c and the connection to a controller, can be varied or modified in many ways without deviating from the idea of the invention. For example, it is conceivable in particular for sensor elements 10, 10a, 10b, 10c to have different dimensions or different shapes. Differently embodied electrode surface dispositions are likewise conceivable. It is moreover conceivable for digital signal transfers from sensor element 10, 10a, 10b, 10c to the respective central units 50, 60 to take place, instead of analog measured values or signal transfers.

Instead of a modular structure of sensor skin 25 from base elements or individual sensor elements 10, 10a, 10b, 10c that are interconnected, it is possible to use a monolithic manufacturing method with which a complete sensor skin 25 can be produced as a single piece (e.g. by injection embedding, production as extruded goods). In addition, in order to enhance safety in the context of the operation of sensor system 100, each of sensor elements 10, 10a, 10b, 10c can have, instead of two mutually independently operating measuring elements 21, 22, a larger number of measuring elements, for example three or four measuring elements.

The system can be used in a variety of application sectors, for example on industrial robots or service robots, mobile platforms, vehicles (in particular unmanned), in medical technology, or in the entertainment industry.

In addition to the safety function, sensor system 10 can take on different or additional surroundings monitoring functions. For example, the interaction of a robot with its surroundings, or gesture recognition, can occur by the fact that a controller combines the sensor data with information regarding the physical disposition of sensor elements 10, 10a, 10b, 10c and interprets it. The evolution of the sensor data over time can also supply useful information in this regard.

In a modification, a capacitance measurement can be carried out by distributing transmission operation and reception operation over two or more sensor elements 10, 10a, 10b, 10c. Field lines 1, 2 of the measurement field then extend over a greater baseline distance; as a result, range is increased and possible gaps between sensor elements 10, 10a, 10b, 10c are closed.

What is claimed is:

1. A sensor system for monitoring surroundings on a mechanical component, comprising:
   at least one capacitive sensor element attachable to a surface of the mechanical component and having a layered structure of electrically conductive and electrically insulating plies;
   wherein electrically conductive potential surfaces of a selected ply are disposed, laterally spaced apart via insulating plies located therebetween, so that electric field lines form between the conductive potential surfaces of the selected ply and change measurably upon at least one of (i) proximity of the sensor element with one of a body or an object, and (ii) contact between the sensor element and one of the body or the object;
   wherein the layered structure of the sensor element has at least two measuring elements configured to operate separately from one another, and
   wherein the at least two measuring elements are situated on an insulating layer of the at least one capacitive sensor element.

2. The sensor system as recited in claim 1, further comprising:
   two control units configured to separately control the two measuring elements, the two control units including (i) a first control unit configured to control and evaluate a first one of the measuring elements, and (ii) a second control unit configured to control and evaluate a second one of the measuring elements.

3. The sensor system as recited in claim 2, wherein the two control units apply control signals to the two measuring elements in chronologically consecutive manner.

4. The sensor system as recited in claim 1, further comprising:
   two evaluation units configured to evaluate measured signals of the at least two measuring elements, wherein the two evaluation units are at least indirectly operatively connected to the mechanical component and apply control to the mechanical component in such a way that operation of the mechanical component occurs only if the signals of the at least two measuring elements are within predetermined limit values.

5. The sensor system as recited in claim 4, wherein multiple capacitive sensor elements are provided, and wherein at least one capacitive sensor element has a base outline in the shape of one of a triangle or a quadrangle, and wherein the multiple sensor elements are electrically and mechanically connected to one another and form a sensor skin.

6. The sensor system as recited in claim 4, wherein the at least two measuring elements are electrically separated from one another.

7. The sensor system as recited in claim 6, wherein the at least two measuring elements are (i) disposed on at least one common layer and (ii) physically separated from one another in the at least one capacitive sensor element.

8. The sensor system as recited in claim 1, further comprising:
   a controller, wherein the at least one capacitive sensor element includes a plurality of capacitive sensor elements and the controller is configured to:
   cyclically address the plurality of capacitive sensor elements; and
   check whether a change in capacitance with respect to a reference value has taken place in at least one of the plurality of capacitive sensor elements.

9. The sensor system as recited in claim 8, wherein the addressing is performed such that different ones of the plurality of capacitive sensor elements are addressed in a chronologically successive manner.

10. The sensor system as recited in claim 8, wherein the addressing is performed such that different ones of the plurality of capacitive sensor elements are addressed simultaneously.

11. The sensor system as recited in claim 8, wherein the plurality of capacitive sensor elements are linearly concatenated to form a chain, and wherein the controller is configured to send information for activating a selected one of the capacitive sensor elements, the information being forwarded along the chain to the selected capacitive sensor element.

12. The sensor system as recited in claim 11, wherein the sensor system is configured for a cyclical self-diagnosis for each of the plurality of capacitive sensor elements, in which self-diagnosis each of the plurality of capacitive sensor elements is acted upon by a test voltage or a characteristic signal pattern.

13. The sensor system as recited in claim 1, wherein the at least two measuring elements are situated so that their detection areas overlap.

* * * * *